United States Patent [19]

Tanaka et al.

[11] 4,173,474
[45] Nov. 6, 1979

[54] HOLOGRAM AND METHOD OF PRODUCTION USING TWO SOLVENT TREATMENTS

[75] Inventors: Takashi Tanaka, Tokyo; Katsuhiko Nishide, Yokohama, both of Japan

[73] Assignee: Canon Kabushiki Kaisha, Tokyo, Japan

[21] Appl. No.: 819,420

[22] Filed: Jul. 27, 1977

[30] Foreign Application Priority Data

Jul. 27, 1976 [JP] Japan .................. 51-89487

[51] Int. Cl.$^2$ .................. G03C 5/04; G03C 5/00; G03C 5/24
[52] U.S. Cl. .................. 430/1; 350/3.61; 430/2; 430/30; 430/306; 430/436
[58] Field of Search ............ 96/27 H, 115 R, 35.1, 96/48 R; 350/3.61

[56] References Cited

U.S. PATENT DOCUMENTS

| | | | |
|---|---|---|---|
| 3,567,444 | 3/1971 | Shankoff | 96/27 H |
| 3,658,526 | 4/1972 | Haugh | 96/27 H |
| 3,660,091 | 5/1972 | Shankoff et al. | 96/49 |
| 3,667,946 | 6/1972 | Sturdevant | 96/35.1 |
| 3,925,077 | 12/1975 | Lewis et al. | 96/35.1 |
| 3,945,825 | 3/1976 | Gale et al. | 96/27 H |
| 4,029,507 | 6/1977 | Wehner et al. | 96/49 |
| 4,049,459 | 9/1977 | Bloom et al. | 96/115 R |
| 4,055,423 | 10/1977 | Bartolini et al. | 96/27 H |

*Primary Examiner*—Edward C. Kimlin
*Attorney, Agent, or Firm*—Fitzpatrick, Cella, Harper & Scinto

[57] ABSTRACT

A hologram comprises a polymer carrier and a portion composed of a polymerization product of a photopolymerizable monomer contained in the polymer carrier, and the polymerization product is produced by exposing the carrier polymer containing the photopolymerizable monomer to an interference pattern of radiation.

9 Claims, 4 Drawing Figures

HOLOGRAM AND METHOD OF PRODUCTION USING TWO SOLVENT TREATMENTS

BACKGROUND OF THE INVENTION

1. Field of the Invention

The present invention relates to a hologram and more particularly to a volume phase hologram.

Hologram, that is, a recording member for recording the interference fringe of light is expected to be widely used in information processing, image indication and optical measurement.

2. Description of the Prior Art

Hologram is classified into two types, that is, a phase type of hologram and an amplitude type of hologram. It is theoretically confirmed that the maximum diffraction efficiency of amplitude hologram is only 7.2%.

The phase hologram may be generally assorted further into two types according to the value of Q of the following equation:

$$Q = (2\pi \lambda d / n_o \Delta^2)$$

The equation was defined by H. Kogelnik wherein $\lambda$ is wavelength of light, d is thickness of photosensitive layer $n_o$ is average refractive index and $\Delta$ is synchronism of interference fringe. For the phase hologram with its Q being at least 10, it is called volume type. When Q is smaller than 10, the phase hologram is called planer type. A higher diffraction efficiency can be obtained from the volume type one. The maximum diffraction efficiency of the volume type phase hologram is theoretically 100%. When photopolymer is used for producing such a volume type phase hologram, the thickness of its sensitive layer becomes necessarily large up to a value from 10 μm to hundreds μm. If dichromate gelatine is used, a volume type phase hologram may be produced by a sensitive layer with the thickness less than 10 μm (several μm).

As hologram recording material, there are known photochromic material, chalcogen glass, thermoplastics, silver salts, photoresist, photopolymer, dichromate gelatine, ferroelectric material and ferromagnetic material. All these material have both merits and demerits. Therefore, those materials are very few which are able to satisfy the requirements for practical use.

With the exception of silver salts, dichromate gelatine and photopolymer, the above mentioned materials have a particular disadvantage that they lack sensitivity to visible rays and therefore their use is limited only to ultraviolet range. Although dichromate gelatine has visible sensitivity, it is not allowed to use any other than chromate, which in turn sets limits to the range of wavelength to which the material is sensitive. Silver salt has a sufficient sensitivity for being used as a hologram material. However, there is a problem of reduction in resolving power and transmission factor (transmittivity) caused by the graininess of silver. In particular, darkening due to its poor light fastness after bleaching is a serious defect of this material. A dichromate gelatine hologram is disclosed in U.S. Pat. No. 3,617,274 and a bleached silver salt hologram in U.S. Pat. No. 3,672,744.

Also, photopolymer has some disadvantages. In order to attain a high diffraction efficiency, it is required to make the sensitive layer extremely thick as described above. Furthermore, in order to obtain the necessary visible sensitivity, there are used sensitizers. These sensitizers remain unchanged in the product and thereby some problems such as decrease of transmission factor and coloring are caused.

SUMMARY OF THE INVENTION

Accordingly it is the primary object of the present invention to provide a hologram which eliminates the above described various disadvantages involved in the known hologram recording materials and which has the following advantageous features while employing a sensitive material of mere several μm thick:

(1) high diffraction efficiency;
(2) high resolving power over 2000 lines/mm;
(3) non-coloring;
(4) high transmission factor;
(5) wide sensitivity ranging from ultraviolet to visible wavelength; and
(6) high sensitivity.

According to one aspect of the present invention, there is provided a member for use as a hologram in coherent optical processing adapted to provide enhanced diffraction efficiency from index of refraction comprising: a polymer carrier responsive to swelling effect of a first solvent and less responsive to swelling effect of a second solvent and a photopolymerizable monomer adapted to form a polymerization product responsive to coherent radiation dispersed in said carrier, said polymerization product responsive to said swelling effect of said first solvent and less responsive to said swelling effect of said second solvent, said monomer adapted to be dissolved by said first solvent, wherein the weight proportion of said carrier to said monomer is from about 1:1 to 100:1.

According to another aspect of the invention, there is provided a method of producing a hologram comprising:

(A) dispersing a photopolymerizable substance into a polymer to form a carrier to provide a sensitive member,
(B) exposing said member to an interference pattern of radiation rays, to provide a recording thereof by polymerization of said photopolymerizable substance, and
(C) removing the unpolymerized portion of said substance from said member.

According to a further aspect of the present invention, there is provided a method of producing a hologram comprising:

(A) a first step wherein a sensitive member is prepared by dispersing a photopolymerizable substance into a polymer by which a carrier is formed,
(B) a second step of exposing said member to an interference pattern of radiation rays,
(C) a third step of contacting the exposed sensitive member with a first solvent capable of providing a difference in swelling in accordance with the interference pattern formed in the sensitive member, and
(D) a fourth step of contacting the exposed sensitive member with a second solvent which is miscible with the first solvent, but relatively weak in swelling action to the sensitive member, and if desired, a step for dissolving away unpolymerized photopolymerizable substance is conducted between steps (B) and (C) above, and further, if desired the first solvent in step (C) is capable of dissolving unpolymerized photopolymerizable substance.

According to still another aspect of the present invention, there are provided holograms produced by the above mentioned methods.

DESCRIPTION OF THE PREFERRED EMBODIMENT

Figure 1:
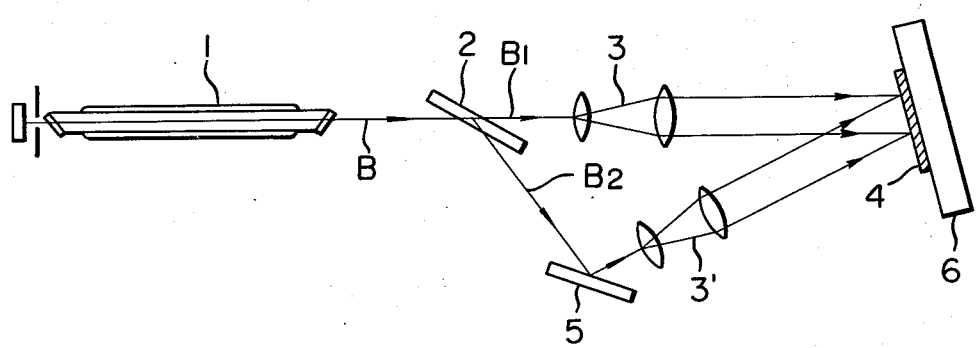
FIG. 1 shows diagrammatically an example of optical system used for carrying out the hologram making method of the invention.

The term "photopolymerizable substance" used in the specification means a composition containing I) a compound having ethylene unsaturated bond (especially monomer) and II) polymerization initiator, further if desired, a photosensitizer may be incorporated to the composition. This is applicable to all the known photopolymerization systems such as pigment sensitizing polymerization, redox polymerization and C-T complex polymerization.

A further details of these photopolymerizable substances is described in G. Oster's article [Chem. Rev. 68 125 (1968)] which article is incorporated herein by reference.

For the purpose of illustration, but not limitation, examples of the components of the photopolymerizable substances used in the invention will be given below:

(I) Examples of compound having ethylene unsaturated bond (photopolymerizable monomer)

vinyl ketones such as acetoxymethyl vinyl ketone, phenylvinyl ketone, and divinyl ketone; maleimides such as maleimide, N-ethyl maleimide and N-3-acetoxypropyl maleimide; acrylic amides such as acrylamide, N-methylol acrylamide and N-N'-methylene bisacrylamide; acrylic esters such as methyl acrylate, triethyleneglycol dimethacrylate and methyl methacrylate; salts of acrylic acid such as barium acrylate, lead acrylate and calcium acrylate; and N-vinyl carbazoles.

(II) Examples of polymerization initiators ketones such as benzophenone, diacetyl and chloroacetone; peroxides such as t-butyl hydroperoxide, benzoyl peroxide and di-t-butyl peroxide; sulphur compounds such as diphenyl disulfide, dibenzothiazole disulfide and tetramethylthiuram monosulfide; azo compounds such as azoxystyrene and azobisisobutyronitrile; halogenides such as iodoform, carbon tetrachloride, and bromotrichloromethane; metal carbonyls such as manganese carbonyl and rhenium carbonyl; metal salts such as iron (III) ammonium citrate, aquopentamminecobalt (III) nitrate and uranyl nitrate; and coloring matters such as riboflavin, methylene blue and Rose Bengal.

In producing the hologram according to the invention, the photopolymerizable substance is to be dispersed into a hologram recording sensitive member in an amount of 1-100 wt% and preferably for practical use in an amount of 2-10 wt% based on the weight of polymer which shall be a carrier of the hologram as described in detail later.

According to the invention, various kinds of polymer are used together with the above described photopolymerizable substance. The polymer is an essential element for constituting the hologram recording sensitive member and is expected to be a carrier thereof.

Examples of polymer useful for the invention include: natural high molecular substances such as gelatine, casein and starch; cellulose derivatives such as cellulose nitrate and carboxymethyl cellulose; semisynthetic high molecular substances such as chlorinated rubber, cyclized rubber and natural rubber plastics; polymerization type synthetic high molecular substances such as polyisobutylene, polystyrol, terpene resin, polyacrylic acid, polyacrylic ester, polymethacrylic ester, polyacrylonitrile, polyacrylamide, polyvinyl acetate, polyvinyl alcohol, polyvinyl pyrolidone, polyacetal resin, polyvinyl pyridine, polyvinyl carbazol, polybutadiene, polystyrene-butadiene, butyl rubber, polyoxy methylene, polyethylene imine, polyethyleneimine hydrochloride and poly(2-acryloxyethyldimethyl sulfonium chloride); condensation polymerization type synthetic high molecular substances such as amino resin, toluene resin, alkyd resin, unsaturated polyester resin, allyl resin, polyamide resin, polyether resin, furan resin and thiokol resin; and addition polymerization type resin such as polyurethane.

Polymers in which the photopolymerizable substance can be well dispersed are preferably selected, and further, it is more preferable to select such polymers that have an adequate activity to the solvent used for the amplifying treatment of hologram according to the invention in addition to the above mentioned property. As to the amplifying treatment, a detailed description will be made later.

The sensitive member for recording a hologram used in the invention is generally prepared in the following manner.

The above mentioned polymer and photopolymerizable substance are mixed together without solvent or with adding a suitable solvent, if necessary, so as to obtain a dispersed mixture. Alternatively, a solution of the above two essential components is initially prepared and then the solution is coated onto a support such as glass and resin films by any suitable method such as spinner method or immersion method. If the polymer itself has a film forming property, then the solution layer may be transformed into a film without using any support.

As another method of preparing the sensitive member, it is also possible to initially coat only the polymer onto a support or make a film of the polymer itself without any support. Thereafter, a solution of the photopolymerizable substance is penetrated into the polymer layer, for example, by immersion so that a sensitive member can be obtained.

The latter mentioned method brings forth many merits compared with the former. For example, at the coating time, the latter method needs not any operation in a darkroom which is advantageous in view of shelf life. The most important merit obtainable from the method is that it allows a broader range of selection of the polymer that is an essential component of the hologram sensitive member and serves as a carrier of hologram.

There may be often a case where one can not find out a solvent capable of dissolving both the polymer and the photopolymerizable substance. Even if there is found such a solvent, it may require a large amount to dissolve both the components. In such a case, a difficulty will arise to obtain the desired thickness of the sensitive member when the solution is coated onto a support. According to the latter mentioned preparing method, different kinds of solvent can be used to dissolve the polymer and dissolve or dilute the photopolymerizable substance, respectively. Therefore, the above described problem and difficulty can be eliminated by employing the method. In addition, the method allows to treat the coated layer of the polymer, if desired, before the penetration of photopolymerizable substance and the photosensitization of the layer. This may be significant for those polymers which are not so good in coating film forming property and apt to peel off or dissolve away when the polymer coated on a support is subjected to the penetration of photopolymerizable substance or brought to contact with solvent at the next step of hologram making process. For such a polymer, it is required to treat it after coating, but before penetration of photopolymerizable substance, otherwise it will give an adverse effect on hologram recording for the reason described above.

The treatment made on the polymer coating layer in such a case may be physical treatment such as heat drying or chemical treatment such as formalin treatment or alum treatment for a protein high molecular polymer such as gelatine.

In this manner, according to the latter mentioned method of preparing a sensitive member for hologram, the otherwise possible adverse effects on hologram recording can be prevented or at least minimized. The treatment of polymer coated on a support will effectively prevent the photopolymerizable substance from being affected by changing in polymerization rate or prepolymerization.

The hologram recording sensitive member prepared in the above described manner is exposed to an interference pattern of an object beam and a reference beam emitted from a source of coherent radiation rays. When exposed, there occurs a photopolymerization of the photopolymerizable substance (for example, a compound having an ethylenic unsaturated bond in the polymer that is a carrier and thereby a hologram is recorded in the member.

This process is carried out by using an optical system as shown in FIG. 1.

In the drawing of FIG. 1, reference numeral 1 designates a radiation ray source from which a coherent beam B is emitted. The coherent beam B is divided into beam $B_1$ and beam $B_2$ by a beam splitter 2. The beams $B_1$ and $B_2$ are enlarged by the optical lens systems 3 and 3' so as to form parallel rays. The sensitive member 4 is exposed to the interference pattern of the two parallel rays. The reference numeral 5 designates a a reflection mirror and 6 is a light absorption plate coated with a reflection preventing paint.

According to the hologram making process using a photopolymer hitherto known, after exposing the sensitive member to the interference pattern, a photofixing process is carried out to the exposed sensitive member.

Du Pont system (AD 760561, Holographic Optical Elements, Section 3, Materials Investigations, 3.3, Photopolymer, p. 61, Jan. 1973, published by National Technical Information Service) and Hughes system (Photoscience and Engineering, Vol 12, p. 177 (1968)) are representative processes.

In the Du Pont process, photopolymerizable substance is dispersed into a layer of high molecular binder and exposed to an interference pattern. Thereafter, it is allowed to stand for a predetermined diffusion time and then it is subjected to a whole surface exposure so that even the unpolymerized portion of the photopolymerizable monomer may be forced to polymerize. Thus, a hologram image is produced.

According to the Hughes process, an aqueous solution of photopolymerizable monomer is introduced into a spacer and exposed to an interference pattern. Thereafter, it is subjected to a whole surface exposure by U V rays so that the sensitizing coloring matter may be made inactive and thereby any further polymerization of the unpolymerized portion of the monomer may become impossible. Thus, a hologram image is obtained.

The two known processes have a common drawback that the sensitive member should have a large thickness to attain a high diffraction efficiency because there is a direct proportional relation between diffraction efficiency and thickness of a sensitive member.

As one data illustrating the fact, it has been reported that for the photopolymer of Du Pont system, the diffraction efficiency was 80% when the thickness of sensitive member was 50 $\mu$m, and for Hughes system, it was 30% with the sensitive member 25 $\mu$m thick.

According to the present invention, after exposing the sensitive member to an interference pattern, it is subjected to a solvent treatment. This solvent treatment constitutes an important feature of the invention. By this treatment, the diffraction efficiency of the hologram is remarkedly amplified. Thus, according to the invention, the diffraction efficiency of some 80% is generally attainable with the sensitive member being only 3 $\mu$m thick.

It has not yet been made clear sufficiently why such a high diffraction efficiency of hologram image can be attained without depending upon the thickness of sensitive member. But, it is believed that the solvent treatment amplifies the change of refraction index in the member. By the solvent treatment, the unpolymerized monomer can be removed and also the sensitizer that is a coloring element can removed at the same time. As a result, it becomes possible to obtain a very clear hologram image. This becomes more effective the less the sensitive member is thick.

If such a solvent is selected for the solvent treatment which can dissolve well the unpolymerized monomer but hardly dissolve the polymer, no substantial effect for increasing the diffraction efficiency will be obtained although fixing of hologram and removing of coloring element can be effected.

According to the invention, the first solvent treatment is carried out by using a first solvent which acts differently in respect of solubility and swelling on the polymerization product of the photopolymerizable monomer produced in accordance with the interference pattern, and on the polymer serving as a carrier; or on the photopolymerized portion of the hologram sensitive member formed in accordance with the interference pattern and on the unpolymerized portion. As a matter of course, the first solvent has a good solubility to the unpolymerized monomer. The second solvent treatment is carried out by using a second solvent which has a miscibility with the first solvent, but has no action or only a very small action on the polymer as well as the photopolymerizable substance as compared with the first solvent.

In this manner, the diffraction efficiency can be improved markedly and further the hologram is fixed and rendered colorless.

Now, the method for producing a hologram of the present invention will be more concretely explained with reference to FIGS. 2A–2C.

For explanation's sake, in the example shown in the drawing, there is used a sensitive member which was prepared by using, as a polymer by which the carrier of hologram is to be formed, a hydrophilic high molecular substance such as gelatin, arabic gum or polyvinyl alcohol, and as a photopolymerizable monomer, a water soluble monomer such as acrylamide or barium acrylate.

Figure 2A:
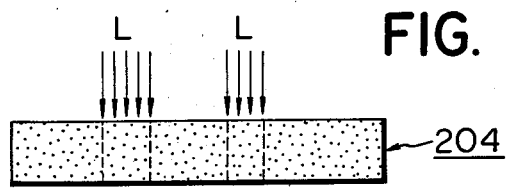
FIGS. 2A through 2C show diagrammatically a sensitive member in different stages of the manufacture of a hologram according to the invention.

The sensitive member 204 is exposed to an interference pattern L as illustrated in FIG. 2A. The exposed sensitive member is then treated (more concretely, for example, immersed) with a solvent such as methanol, ethanol, isopropyl alcohol or THF. The solvent used in this treatment is such kind of solvent which can dissolve the water soluble monomer very well but does not substantially dissolve the polymerization product of the monomer or the polymer serving as carrier.

Figure 2B:
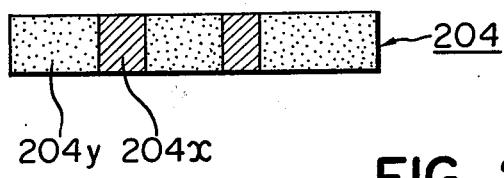
Figure 2C:
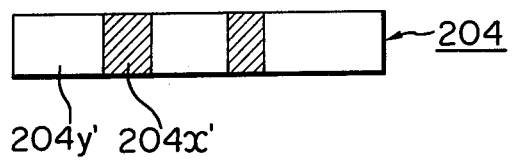

By this treatment, only the photopolymerizable monomer existing in the unexposed portion 204y is selectively removed as illustrated in FIG. 2B. The polymerized monomer in the exposed portion remains in the carrier polymer as distributed in accordance with the interference pattern as illustrated in FIG. 2C and thereby a hologram is produced.

In this hologram producing method, the change in refractive index of the produced hologram depends upon the difference:

($n_1 - n_2$) wherein $n_1$ is intrinsic refractive index of carrier polymer and $n_2$ is an average refractive index of the carrier polymer and the polymerization product of photopolymerizable monomer. If the refractive index of the polymerization product of the monomer is $n_3$ and the ratio in amount of the polymer to the polymerization product of the monomer is a:b, then the average refractive index $n_2$ will be given by the following equation:

$$n_2 = [(an_1 + bn_3)/(a+b)]$$

In this case, the change of refractive index which is contributive to the diffraction efficiency is directly proportional to the thickness of sensitive member then used. Therefore, it is difficult to obtain a high diffraction efficiency by employing the thickness of sensitive member of only several $\mu$m.

However, according to the above described method comprising the first solvent treatment for the sensitive member with a first solvent and the second solvent treatment with a second solvent, a higher diffraction efficiency of hologram can be obtained.

The first solvent which may be, for example, water or a water-alcohol mixture, has a solubility and a swelling action to the carrier polymer as well as the photopolymerization product. After the first treatment, the sensitive member in a swelled state is subjected to the second treatment with a second solvent such as ethanol, isopropyl alcohol and THF which has a miscibility with the first solvent but does not substantially dissolve the polymer. At this time, an internal strain in accordance with the interference pattern is applied to the hologram sensitive member with the change in solvent. The internal strain is further increased by removing the solvent by drying. For the reason, the change of refractive index is amplified between the portion 204x' and the portion 204y' shown in FIG. 2C and the difference in refractive index between the two portions becomes a value far larger than the difference in intrinsic refractive index of the two different materials constituting the sensitive member. This allows to produce a hologram of higher diffraction efficiency as compared with the first mentioned hologram producing method.

In a similar manner, when as the carrier polymer, a hydrophobic high molecular substance such as polyvinyl carbazol, polystyrene or polyvinyl pyridine is used, a hologram of high diffraction efficiency also can be produced by the two step solvent treatment while employing as a first solvent, toluene, xylene or chloroform and as a second solvent, for example, an alcohol or n-hexane. These two solvent treatments and the succeeding drying bring forth a amplified change of internal refractive index for the same reason as described above.

As will be understood from the foregoing, the solvent treatment process in the invention is a critical factor determining the degree of diffraction efficiency of hologram produced.

The hologram formed in the exposure step is subjected to the solvent treatment and thereby the change of its refractive index is amplified, which results in the desired high diffraction efficiency of hologram.

In order to attain a high diffraction efficiency, it is necessary to control the solubility of solvent in such a manner that either one of the two portions 204x and 204y shown in FIG. 2B may be much more swelled than the other which is scarcely affected by the action of solvent.

This control may be done by suitably selecting the kind of solvents to be used and, if the same solvent is to be used, by the different of dissolving power depending upon temperature.

The solvent treatment in the present invention may be carried out by firstly dissolving away the unpolymerized photopolymerizable substance with a first solvent capable of dissolving the photopolymerizable substance, then contacting the exposed sensitive member with a second solvent capable of providing a difference in swelling in accordance with the interference pattern formed in the sensitive member, and finally treating with a third solvent which is miscible with the second solvent, but relatively weak in swelling action to the sensitive member.

The following examples are given for the purpose of illustrating the present invention, but not for limiting the present invention.

EXAMPLE 1

Acrylamide—100 g
N,N'-methylene bisacrylamide—10 g
Triethanolamine—5 g
Methylene blue—0.01 g
Water—100 ml 1 g of a photosensitive liquid having the above given composition was mixed with 7 g of 20% aqueous solution of gelatin and heated to 45° C. The resultant warm mixture was coated onto a glass plate by employing a spinner as to form a coating layer 3 $\mu$m thick. By naturally drying it, a recording sensitive member was produced.

A hologram recording was carried out by using an optical system as shown in FIG. 1 where an exposure energy of 50 mJ/cm$^2$ was applied to the above prepared sensitive member with a He-Ne laser at the wavelength of 633 nm.

Then, it was washed with water at 20° C. for two minutes. Thereafter, it was immersed into a bath of isopropyl alcohol containing 30% water at 20° C. for 30 sec. and then in a bath of isopropyl alcohol at 20° C. for 2 min. Immediately after the second immersion, it was dried with hot air by a dryer. In this manner, a complete hologram was produced.

The hologram (volume type phase hologram) thus produced was found to have the diffraction efficiency of 79% and the spatial frequency of 2000 lines/mm.

EXAMPLE 2

Acrylamide—100 g
N,N'-methylene bisacrylamide—10 g
Triethanolamine—5 g
Methylene blue—0.01 g
Water—300 ml Into a photosensitive liquid having the above given composition, a layer 3 μm thick of gelatin which has preliminarily been hardened on a glass plate was immersed for five minutes and then allowed to stand for two hours to dry. In this manner, a sensitive member was prepared.

A hologram recording was carried out by using an optical system as shown in FIG. 1 where an exposure energy of 50 mJ/cm$^2$ was applied to the sensitive member with a He-Ne laser at the wavelength of 633 nm.

Then, it was washed with water and subjected to an immersion. The immersion was effected by using first a bath of isopropyl alcohol containing 30% water with the immersion time of 30 sec. and secondly a bath of isopropyl alcohol with the immersion time of two minutes. Immediately after the second immersion, it was dried with hot air by a dryer. Thus, a hologram was produced which had a spatial frequency of 2000 lines/mm.

The above procedure was repeated changing the washing condition variously as given in the following table and thereby the diffraction efficiency of hologram changed as follows:

| Washing condition | | Diffraction efficiency |
|---|---|---|
| Water temp. (°C.) | Washing time (min.) | of hologram (%) |
| 20 | 2 | 7 |
| 25 | 2 | 22 |
| 30 | 2 | 68 |

Also, the above procedure was repeated changing the amount of exposure energy (but washing condition is maintained constant; 30° C., 2 min.). The diffraction efficiency of hologram varied as follows;

Relation between exposure energy and diffraction efficiency

| Exposure energy (mJ/cm$^2$) | Diffraction efficiency of hologram (%) |
|---|---|
| 10 | 4 |
| 30 | 38 |
| 50 | 68 |
| 70 | 77 |
| 90 | 79 |
| 110 | 78 |

EXAMPLES 3–6

A hydrophilic substance 1, was coated onto a glass plate to form a coating layer 3 μm thick and hardened. Then, it was immersed in a photosensitive liquid bath containing a monomer having hydrophilic group 2, for 5 minutes. After natural drying for 2 hours, a sensitive member was obtained.

Employing an optical system as shown in FIG. 1, a hologram recording was carried out by exposing the sensitive member to laser beam 3. After washing it with water 4, the exposed member was immersed initially in a bath of isopropyl alcohol containing 30% water for 30 sec. and secondly in a bath of isoproyyl alcohol for two minutes. Immediately after the second immersion treatment, it was dried with hot air by a dryer. In this manner, a hologram 5, was produced.

The concrete data of the items 1, through 5, were as follows:

EXAMPLE 3

1, methyl cellulose
2, barium acrylate—100 g, methylene blue—0.01 g, p-toluene-sulfinic soda—0.3 g and water—300 ml
3, He-Ne laser, 633 nm and 30 mJ/cm$^2$
4, 30° C. and 2 min.
5, diffraction efficiency=73%, spatial frequency=2000 lines/mm

EXAMPLE 4

1, polyvinyl alcohol
2, acrylamide—100 g, N,N'-methylene bisacrylamide—10 g, iron (III) citrate ammonium—5 g, t-butylhydroperoxide —1 g and water—300 ml.
3, Ar laser, 451 nm and 50 mJ/cm$^2$
4, 60° C. and 5 min.
5, diffraction efficiency=53% and spatial frequency=2800 lines/mm

EXAMPLE 5

1, gum arabic
2, N-methylolacrylamide—100 g, N,N'-methylene bisacrylamide—10 g, triethanolamide—5 g, acryldine orange—0.01 g and water—300 ml
3, Ar laser, 488 nm and 80 mJ/cm$^2$
4, 45° C. and 2 min.
5, diffraction efficiency=75% and spatial frequency=2600 lines/mm

EXAMPLE 6

1, albumin
2, N-methylolacrylamide—100 g, N,N'-methylene bisacrylamide —10 g, riboflavin—0.01 g and water—300 ml
3, He-Cd, 441 nm and 50 mJ/cm$^2$
4, 30° C. and 3 min.
5, diffraction efficiency=81% and spatiral frequency=2900 lines/mm

EXAMPLE 7

Acrylamide—9 g
N-methylacrylamide—1 g
N,N'-methylene bisacrylamide—1 g
Methylene blue—0.001 g
Triethanolamine—0.5 g
Polyvinylbutyral—30 g
Ethanol—100 ml A photosensitive liquid of the above given composition was coated onto a glass plate by a spinner up to 3 μm thickness and naturally dried. In this manner a sensitive member was prepared.

On the member thus prepared, there was carried out a hologram recording employing an optical system as shown in FIG. 1 with a He-Ne laser at the wavelength of 633 nm where an exposure energy of 50 mJ/cm$^2$ was applied.

The exposed sensitive member was immersed at first in a bath of a 50% aqueous solution of methanol at room temperature for 10 min. and secondly in an immersion bath of a solvent mixture (1:1) of isopropyl alcohol and toluene at 40° C. for 10 sec. Immediately after washing it with n-hexane for 30 sec., drying was carried out with hot air. Thus, a hologram was produce, which was found to have a diffraction efficiency of 61% and a spatial frequency of 2000 lines/mm.

EXAMPLE 8

Acrylamide—9 g
N-methylacrylamide—1 g
N,N'-methylene bisacrylamide—1 g
Methylene blue—0.001 g
Triethanolamine—0.5 g
2-vinylpyridine and 2-methyl-5-vinylpyridine—25 g copolymer
THF—70 ml A photosensitive liquid of the above given composition was coated onto a glass plate by a spinner to form a layer 3 μm thick and naturally dried. In this manner, a sensitive member was prepared.

A hologram recording was carried out using an optical system as shown in FIG. 1 with a He-Ne laser at the wavelength of 633 nm where 100 mJ/cm² of exposure energy was applied to the above prepared sensitive member. The exposed member was immersed firstly in a bath of an 80% aqueous solution of ethanol at room temperature for 10 min. and secondly in a solvent mixture (1:2) of carbon tetrachloride and THF at 40° C. for 30 sec. Lastly, it was immersed in a bath of carbon tetrachloride at room temperature for one minute and then dried with hot air.

Thus, a hologram was obtained which showed a diffraction efficiency of 73% and a spatial frequency of 2000 lines/mm.

EXAMPLE 9

N-vinylcarbazole—10 g
Acrylic resin—35 g
NaAuCl$_4$2H$_2$O—0.1 g
Acetone—10 ml

A photosensitive liquid with the above given composition was coated onto a glass plate by a spinner in the thickness of 3 μm, and naturally dried. In this manner, a sensitive member was prepared.

A hologram recording was conducted using an optical system as shown in FIG. 1 with an Ar laser at the wavelength of 488 nm where 200 mJ/cm² of exposure energy was applied to the above prepared sensitive member. The exposed member was immersed firstly in a bath of ethanol at room temperature for 10 min. and secondly in isopropyl ether at 40° C. for 2 min. Lastly, it was immersed in a bath of xylene at room temperature for one minute and then naturally dried.

Thus, a hologram was obtained the diffraction efficiency of which was 65% and the spatial frequency was 2600 lines/mm.

EXAMPLE 10

Ethyleneglycol diacrylate—5 g
Methyl methacrylate—5 g
Benzoin—0.05 g
Polystyrene—40 g
THF—100 ml A photosensitive liquid of the above given composition was coated onto a glass plate by a spinner in the thickness of 3 μm and naturally dried. In this manner, a sensitive member was prepared.

A hologram recording was conducted employing an optical system as shown in FIG. 1 with a Kr laser at the wavelength of 351 nm where 300 mJ/cm² of exposure energy was applied to the above prepared sensitive member while heating it at 50° C.

The exposed member was immersed firstly in a bath of isopropyl alcohol at room temperature for 5 min. and secondly in a mixture (3:1) of chloroform and isopropyl ether at 30° C. for 30 sec. Lastly, it was brought into an immersion bath of n-hexane at room temperature for one minute and then naturally dried.

Thus, a hologram was obtained which had a diffraction efficiency of 67% and a spatial frequency of 3000 lines/mm.

From the above described examples, it will be appreciated that according to the invention, even when the thickness of the sensitive member is very small, a clear volume type phase hologram with a higher diffraction efficiency is obtainable.

What we claim is:

1. A method of producing a hologram comprising:
   (A) a first step wherein a sensitive member is prepared by dispersing a photopolymerizable substance into a polymer by which a carrier is formed,
   (B) a second step of exposing said member to an interference pattern of radiation rays,
   (C) a third step of contacting the exposed sensitive member with a first solvent capable of providing a difference in swelling in accordance with the interference pattern formed in the sensitive member, and
   (D) a fourth step of contacting the exposed sensitive member with a second solvent which is miscible with the first solvent, but relatively weak in swelling action to the sensitive member whereby a hologram having an unexpectedly high diffraction efficiency relative to the thickness of the sensitive member is formed.

2. A method as claimed in claim 1, wherein said hologram is a volume phase hologram.

3. A method as claimed in claim 1, wherein said polymer is a hydrophilic high molecular substance.

4. A method as claimed in claim 1, wherein said polymer is a hydrophobic high molecular substance.

5. A method as claimed in claim 1, wherein said photopolymerizable substance is a compound containing ethylenic unsaturated bond.

6. A method as claimed in claim 1, wherein said photopolymerizable substance is a water soluble monomer.

7. A method as claimed in claim 1, wherein a step for dissolving away unpolymerized photopolymerizable substance is effected between steps (B) and (C).

8. A method as claimed in claim 1, wherein the first solvent in step (C) is capable of dissolving unpolymerized photopolymerizable substance.

9. A hologram produced by
   (A) a first step wherein a sensitive member is prepared by dispersing a photopolymerizable substance into a polymer by which a carrier is formed,
   (B) a second step of exposing said member to an interference pattern of radiation rays,
   (C) a third step of contacting the exposed sensitive member with a first solvent capable of providing a difference in swelling in accordance with the interference pattern formed in the sensitive member, and
   (D) a fourth step of contacting the exposed sensitive member with a second solvent which is miscible with the first solvent, but relatively weak in swelling action to the sensitive member whereby a hologram having an unexpectedly high diffraction efficiency relative to the thickness of the sensitive member is formed.

* * * * *